(12) United States Patent
Hattori et al.

(10) Patent No.: US 8,836,211 B2
(45) Date of Patent: Sep. 16, 2014

(54) WHITE LIGHT EMITTING DEVICE CONTAINING THREE FLUORESCENT MATERIALS HAVING DIFFERENT PEAK WAVELENGTHS

(75) Inventors: Yasushi Hattori, Kanagawa (JP); Aoi Okada, Kanagawa (JP); Ryosuke Hiramatsu, Kanagawa (JP); Kunio Ishida, Tokyo (JP); Masahiro Kato, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/597,808

(22) Filed: Aug. 29, 2012

(65) Prior Publication Data

US 2013/0234584 A1  Sep. 12, 2013

(30) Foreign Application Priority Data

Mar. 9, 2012  (JP) ................. 2012-053378

(51) Int. Cl.
  *H01J 1/62* (2006.01)
  *H01J 63/04* (2006.01)
(52) U.S. Cl.
  USPC ........... 313/503; 313/483; 313/500; 313/501; 313/502; 313/504; 313/505; 313/506
(58) Field of Classification Search
  None
  See application file for complete search history.

(56) References Cited

U.S. PATENT DOCUMENTS

| | | | |
|---|---|---|---|
| 7,253,446 B2* | 8/2007 | Sakuma et al. | 257/98 |
| 7,326,965 B2 | 2/2008 | Onishi et al. | |
| 7,884,538 B2 | 2/2011 | Mitsuishi et al. | |
| 8,653,549 B2* | 2/2014 | Yoo et al. | 257/98 |
| 2006/0208262 A1* | 9/2006 | Sakuma et al. | 257/79 |
| 2009/0146549 A1 | 6/2009 | Kimura et al. | |
| 2010/0187974 A1 | 7/2010 | Zhang et al. | |
| 2010/0213822 A1 | 8/2010 | Shimooka et al. | |
| 2012/0306356 A1* | 12/2012 | Yoon et al. | 313/503 |

FOREIGN PATENT DOCUMENTS

| | | |
|---|---|---|
| JP | 2006-261512 A | 9/2006 |
| JP | 2006-261521 | 9/2006 |
| JP | 2008-135707 | 6/2008 |
| KR | 10-2011-0102063 | 9/2011 |
| KR | 10-2012-0014853 | 2/2012 |
| WO | WO 2009/017206 | 2/2009 |
| WO | WO 2010/041195 | 4/2010 |

OTHER PUBLICATIONS

U.S. Appl. No. 14/134,293, filed Dec. 19, 2013, Matsuda, et al.

(Continued)

*Primary Examiner* — Natalie Walford
(74) *Attorney, Agent, or Firm* — Oblon, Spivak, McClelland, Maier & Neustadt, L.L.P.

(57) ABSTRACT

A white light emitting device according to an embodiment includes: a light emitting element having a peak wavelength in a wavelength range of 430 nm or more and 470 nm or less; a first fluorescent material emits light with a first peak wavelength of 525 nm or more and 560 nm or less; a second fluorescent material emits light with a second peak wavelength longer than the first peak wavelength; and a third fluorescent material emits light with a third peak wavelength of 620 nm or more and 750 nm or less, which is longer than the second peak wavelength. The first fluorescent material and the second fluorescent material has a composition of $MSi_\alpha O_\beta N_\gamma$, and when the first peak wavelength is denoted by $\lambda 1$ (nm), whereas the second peak wavelength is denoted by $\lambda 2$ (nm), $1100 \leq \lambda 1 + \lambda 2$ and $\lambda 2 - \lambda 1 \leq 60$ are satisfied.

20 Claims, 4 Drawing Sheets

(56) References Cited

OTHER PUBLICATIONS

Japanese Office Action mailed Apr. 15, 2014, in corresponding Japanese Patent Application No. 2012-053378 (with English-language Translation).

European Search Report entered in corresponding European patent application EP 13 15 6044 issued Apr. 23, 2014.

Korean Office Action issued Mar. 21, 2014, in corresponding Korean Patent Application No. 10-2013-0020225 (with English-language Translation).

* cited by examiner

WHITE LIGHT EMITTING DEVICE CONTAINING THREE FLUORESCENT MATERIALS HAVING DIFFERENT PEAK WAVELENGTHS

CROSS-REFERENCE TO RELATED APPLICATION

This application is based upon and claims the benefit of priority from Japanese Patent Application No. 2012-053378, filed on Mar. 9, 2012, the entire contents of which are incorporated herein by reference.

FIELD

Embodiments described herein relate generally to a white light emitting device.

BACKGROUND

Light emitting devices using a light emitting diode (LED) are mainly composed of a combination of an LED chip as an excitation light source and a fluorescent material. Further, a variety of luminescent colors can be achieved depending on the combination.

For white LED light emitting devices for emitting white light, for example, a combination of an LED chip for emitting blue light with a fluorescent material is used. As the fluorescent material, a yellow fluorescent material is mainly used which emits light complementary to blue, and with the LED chip, used as a pseudo white light LED. Besides, three-wavelength white LEDs have been developed which use an LED chip for emitting blue light, a green to yellow fluorescent material, and a red fluorescent material.

It is desirable for the white light emitting devices to achieve high color rendering properties, in particular, a high average color rendering index (Ra) in order to reproduce a color close to natural light. In addition, for lower power consumption, the devices require a balance with a high luminescent efficiency.

DETAILED DESCRIPTION

A white light emitting device according to an embodiment includes: alight emitting element which has a peak wavelength in a wavelength range of 430 nm or more and 470 nm or less; a first fluorescent material which emits light with a first peak wavelength of 525 nm or more and 560 nm or less; a second fluorescent material which emits light with a second peak wavelength longer than the first peak wavelength; and a third fluorescent material which emits light with a third peak wavelength of 620 nm or more and 750 nm or less, which is longer than the second peak wavelength. Further, the first fluorescent material and the second fluorescent material have a composition of $MSi_\alpha O_\beta N_\gamma$ (However, M includes Eu, necessarily includes Sr or Ba, and may further include Ca, Mg, and Zn. Furthermore, M may contain, as an activator agent, element(s) selected from the group including Ti, Pb, Mn, As, Al, Pr, Tb, and Ce. In addition, $\alpha$, $\beta$, and $\gamma$ satisfy $1.8 \leq \alpha \leq 2.4$, $1.8 \leq \beta \leq 2.2$, and $1.8 \leq \gamma \leq 2.2$.), and when the first peak wavelength is denoted by $\lambda 1$ (nm), whereas the second peak wavelength is denoted by $\lambda 2$ (nm), conditions of $1100 \leq \lambda 1 + \lambda 2$ and $\lambda 2 - \lambda 1 \leq 60$ are satisfied.

Embodiments will be described below with reference to the drawings.

First Embodiment

A white light emitting device according to the present embodiment includes: a light emitting element which has a peak wavelength in a wavelength range of 430 nm or more and 470 nm or less; a first fluorescent material which emits light with a first peak wavelength of 525 nm or more and 560 nm or less; a second fluorescent material which emits light with a second peak wavelength longer than the first peak wavelength; and a third fluorescent material which emits light with a third peak wavelength of 620 nm or more and 750 nm or less, which is longer than the second peak wavelength. Further, the first fluorescent material and the second fluorescent material have a composition of:

$$MSi_\alpha O_\beta N_\gamma$$

(However, M includes Eu, necessarily includes Sr or Ba, and may further include Ca, Mg, and Zn. Furthermore, M may contain, as an activator agent, element(s) selected from the group including Ti, Pb, Mn, As, Al, Pr, Tb, and Ce. In addition, $\alpha$, $\beta$, and $\gamma$ satisfy $1.8 \leq \alpha \leq 2.4$, $1.8 \leq \beta \leq 2.2.2$, and $1.8 \leq \gamma \leq 2.2$.) when the first peak wavelength is denoted by $\lambda 1$ (nm), whereas the second peak wavelength is denoted by $\lambda 2$ (nm), conditions of $1100 \leq \lambda 1 + \lambda 2$ and $\lambda 2 - \lambda 1 \leq 60$ are satisfied.

The white light emitting device according to the present embodiment has the configuration described above, thereby making it possible to achieve high color rendering properties, in particular, a high average color rendering index Ra and a high luminescent efficiency. More specifically, the combination of, the light emitting element for emitting blue light, two kinds of yellow-green to orange fluorescent materials of the same host (or structure) which are different in peak wavelength, and the red fluorescent material makes it possible to achieve a balance between high color rendering properties and a high luminescent efficiency.

Figure 1:
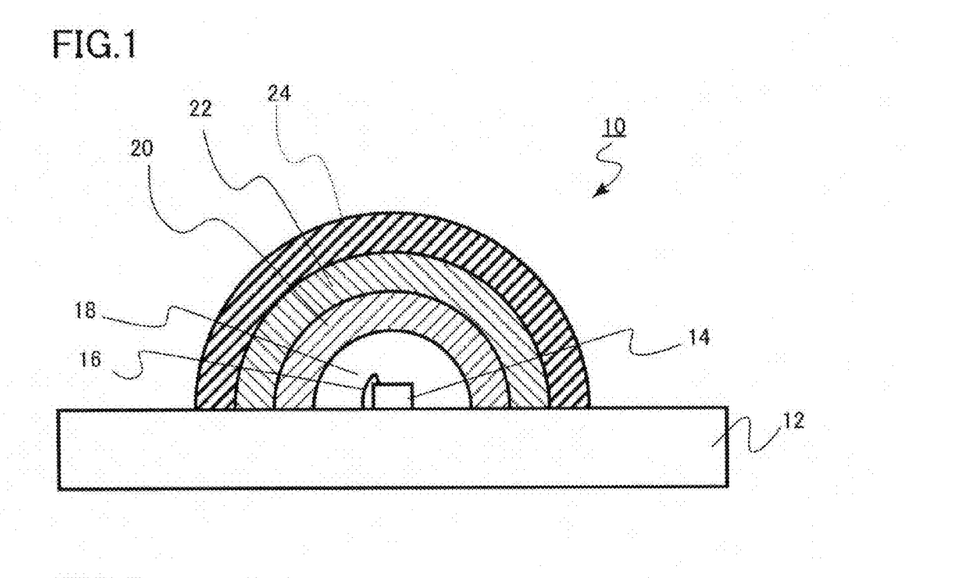
FIG. 1 is a schematic cross-sectional view of a light emitting device according to a first embodiment.

FIG. 1 is a schematic cross-sectional view of a light emitting device according to the present embodiment. This light emitting device 10 is a white light emitting device which emits white light. In particular, the light emitting device 10 is a white light emitting device which has a luminescent color of a incandescent lamp color (2800 K).

The white light emitting device 10 includes a substrate 12 which has a flat surface with a light emitting element to be mounted. For example, a highly reflective material is used for the substrate 12.

Further, as a light emitting element 14 which emits light with a peak wavelength of 430 nm or more and 470 nm or less in wavelength, a blue LED chip, for example, is mounted on the flat surface of the substrate 12. The blue LED chip is connected to a wiring, not shown, through, for example, a gold wire 16. Further, the external supply of a driving current through this wiring to the blue LED chip causes the blue LED chip to produce blue light for excitation.

The blue LED chip is, for example, an AlGaInN based LED which has GaInN as a light emitting layer.

An element sealing transparent layer 18 composed of a hemispherically-shaped transparent resin is provided on the light emitting element 14. The transparent resin is, for example, a silicone resin.

Furthermore, a first fluorescent layer 20 with a circumference semicircular in cross section perpendicular to the flat surface is formed so as to cover the element sealing transparent layer 18. The first fluorescent layer 20 contains therein a first fluorescent material which emits light with a first peak wavelength of 525 nm or more and 560 nm or less, with the use of light emitted from the light emitting element 14 as excitation light.

The first fluorescent material (hereinafter, an abbreviation of Y1 also used) is a yellow-green to yellow fluorescent material. The first fluorescent layer 20 is formed by dispersing, for example, yellow-green to orange fluorescent material particles in, for example, a transparent silicone resin. The first fluorescent layer 20 absorbs blue light generated from the blue LED to convert the blue light to yellow-green to yellow light.

A second fluorescent layer 22 with a circumference semicircular in cross section perpendicular to the flat surface is formed so as to cover the first fluorescent layer 20. The second fluorescent layer 22 contains therein a second fluorescent material which emits light with a second peak wavelength longer than the first peak wavelength, with the use of light emitted from the light emitting element 14 as excitation light.

The second fluorescent material (hereinafter, an abbreviation of Y2 also used) is a yellow to orange fluorescent material. The second fluorescent layer 22 is formed by dispersing, for example, yellow to orange fluorescent material particles in, for example, a transparent silicone resin. The second fluorescent layer 22 absorbs blue light generated from the blue LED to convert the blue light to yellow to orange light.

The first fluorescent material and the second fluorescent material are both so-called SION based fluorescent materials which have the following composition:

$$MSi_\alpha O_\beta N_\gamma$$

(However, M represents two or more metals including europium (Eu), and necessarily includes strontium (Sr) or barium (Ba), and may further include calcium (Ca), magnesium (Mg), and zinc (Zn). Furthermore, M may contain, as an activator agent, element(s) selected from the group including titanium (Ti), lead (Pb), manganese (Mn), arsenic (As), aluminum (Al), praseodymium (Pr), terbium (Tb), and cerium (Ce). In addition, $\alpha$, $\beta$, and $\gamma$ satisfy $1.8 \leq \alpha \leq 2.4$, $1.8 \leq \beta \leq 2.2$, and $1.8 \leq \gamma \leq 2.2$.)

Further, more preferably, $\alpha$, $\beta$, and $\gamma$ satisfy $2.0 \leq \alpha \leq 2.2$, $1.8 \leq \beta \leq 2.1$, and $1.9 \leq \gamma \leq 2.2$.

Furthermore, preferably, the first fluorescent material and the second fluorescent material both have the following composition:

$$(Sr_{(1-x-y-z)}Ba_xCa_yEu_z)Si_2O_2N_2$$

(in the formula, $0 \leq x < 1$, $0 \leq y \leq 1$, $0.01 \leq z \leq 0.2$)

It is possible to adjust the emission wavelength of the oxynitride fluorescent material containing Si, which is represented by this formula, by, for example, changing the composition in terms of x and y, and fluorescent materials can be obtained which have more than one emission wavelength in the same host. Further, in order to stabilize the crystal structure or enhance the emission intensity, some of strontium (Sr), barium (Ba), and calcium (Ca) may be substituted for at least either one of Mg and Zn. In addition, at least one element selected from the group including Ti, Pb, Mn, As, Al, Pr, Tb, and Ce may be contained in minute amounts as an activator agent.

The SION based fluorescent material has excellent temperature characteristics of changes in luminescent efficiency by approximately 10% or less at 25° C. to 150° C. Therefore, it is possible to suppress color deviations in the white light emitting device during high-temperature operation.

Furthermore, a third fluorescent layer 24 with a circumference semicircular in cross section perpendicular to the flat surface is formed so as to cover the second fluorescent layer 22. The third fluorescent layer 24 contains therein a third fluorescent material which emits light with a third peak wavelength of 620 nm or more and 750 nm or less, which is longer than the second peak wavelength, with the use of light emitted from the light emitting element 14 as excitation light.

The third fluorescent material (hereinafter, an abbreviation of R also used) is a red fluorescent material. The third fluorescent layer 24 is formed by dispersing, for example, red fluorescent material particles in, for example, a transparent silicone resin. The third fluorescent layer 24 absorbs blue light generated from the blue LED to convert the blue light to red light.

The third fluorescent material is, for example, $Ca_2Si_y Al_{(12-y)}O_zN_{(16-z)}$:Eu, a so-called CASN-based fluorescent material.

Simulation results will be described below which show the function and effect of the present embodiment. In the simulation, figured out were the color rendering properties and luminescent efficiency of the white light emitting device.

For the simulation, calculations were performed by adding up a measured spectrum for the blue LED, an emission spectrum for an SION based yellow fluorescent material excited by the blue LED, and an emission spectrum for a CASN based red fluorescent material excited by the blue LED. An emission spectrum with a peak wavelength of 563 nm was used as the emission spectrum for the SION based yellow fluorescent material. An emission spectrum with a peak wavelength of 653 nm was used as the emission spectrum for the CASN based red fluorescent material.

In addition, as for the luminescent efficiency, the theoretical value of the luminescent efficiency, that is, the lumen equivalent (lumen/watt of emission) was used as an index, in order to ignore the efficiency of the light emitting element and the efficiencies of the fluorescent materials.

First, for comparison, the color rendering properties and luminescent efficiency were simulated for the combination of the blue light emitting element, one kind of SION based yellow-green to orange fluorescent material, and a red fluorescent material.

The peak wavelength and peak intensity ratio of a yellow-green to orange fluorescent material and the peak intensity ratio of a red fluorescent material were adjusted so that the chromaticity of a spectrum obtained by adding the peak wavelength of the yellow-green to orange fluorescent material as a variable to a spectrum for a blue LED with an emission wavelength of 455 nm was adapted to a incandescent lamp color (Cx=0.4519, Cy=0.4087) at 2800 K. A measured spectrum for a yellow fluorescent material with a peak wavelength of 563 nm was shifted and used as the spectrum for the yellow-green to orange fluorescent material.

Figure 2:
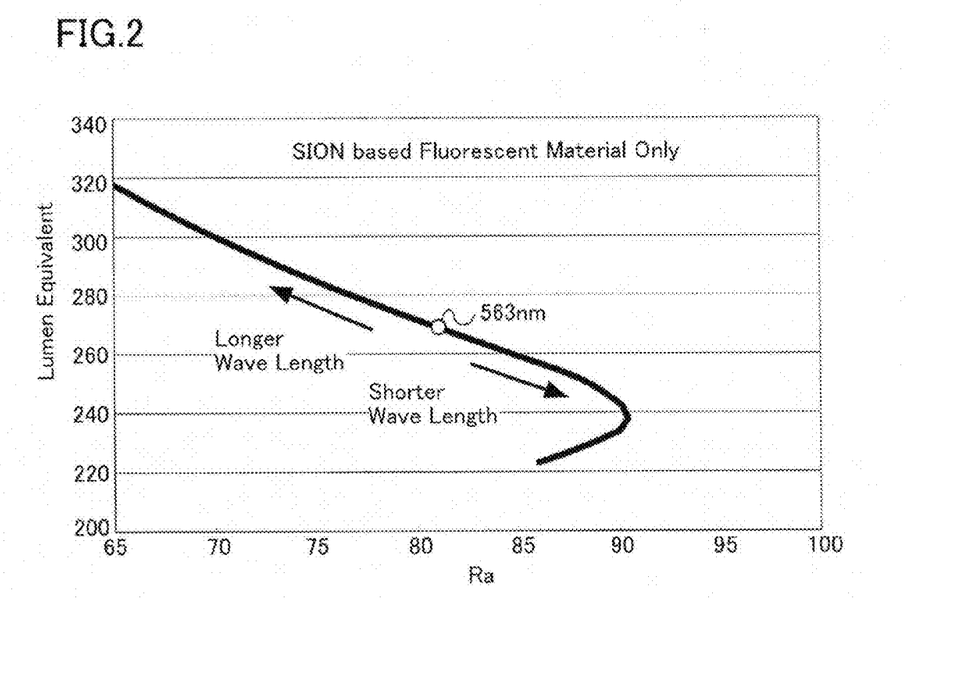
FIG. 2 is a diagram showing a simulation result in the case of one kind of SION based fluorescent material.

FIG. 2 is a diagram showing a simulation result in the case of SION based fluorescent material only. In this case only one kind of SION based fluorescent material is used. In the figure, the horizontal axis indicates an average color rendering index Ra, whereas the vertical axis indicates a lumen equivalent (1 m/W).

In the case of the SION based fluorescent material only, a characteristic curve was obtained which shows correlation between the Ra and the luminescent efficiency as shown in FIG. 2. In the case of the SION based fluorescent material only, the shift of the peak wavelength from 563 nm to the longer wavelength side decreases the Ra, but improves the luminescent efficiency. Alternatively, the shift of the peak wavelength from 563 nm to the shorter wavelength side improves the Ra, but decreases the luminescent efficiency.

Next, the color rendering properties and luminescent efficiency were simulated for the combination of the blue light emitting element with two kinds of fluorescent materials different in peak wavelength, selected from yellow-green to orange SION based fluorescent materials. Hereinafter, the fluorescent material with a peak wavelength on the shorter wavelength side is referred to as Y1, whereas the fluorescent material with a peak wavelength on the longer wavelength side is referred to as Y2.

The peak wavelengths and peak intensity ratios of two kinds of yellow-green to orange fluorescent materials and the peak intensity ratio of a red fluorescent material were adjusted so that the chromaticity of a spectrum obtained by adding together respective spectra for the yellow-green to orange fluorescent materials and the red fluorescent material to a spectrum for a blue LED with an emission wavelength of 455 nm was adapted to a incandescent lamp color (Cx=0.4519, Cy=0.4087) at 2800 K. The respective peak wavelengths λ1 and λ2 of the fluorescent materials Y1 and Y2 were used as variables.

As the procedure for a specific simulation, first, the peak wavelength of Y1 was varied by 2 nm between 520 nm and 565 nm, whereas the peak wavelength of Y2 was varied by 2 nm from the peak wavelength of Y1 to a difference of 60 nm. Then, in each of the combinations of peak wavelengths, the intensity ratio among Y1, Y2, and R was adjusted so that the chromaticity of the spectrum was adapted to a incandescent lamp color at 2800 K. The color rendering properties and luminescent efficiency were obtained from the resultant spectrum. As for the full width at half maximum, typical values for the SION fluorescent materials were used. More specifically, a value of 100 nm was used for Y1 on the shorter wavelength side, whereas a value of 80 nm was used for Y2 on the longer wavelength side.

Figure 3:
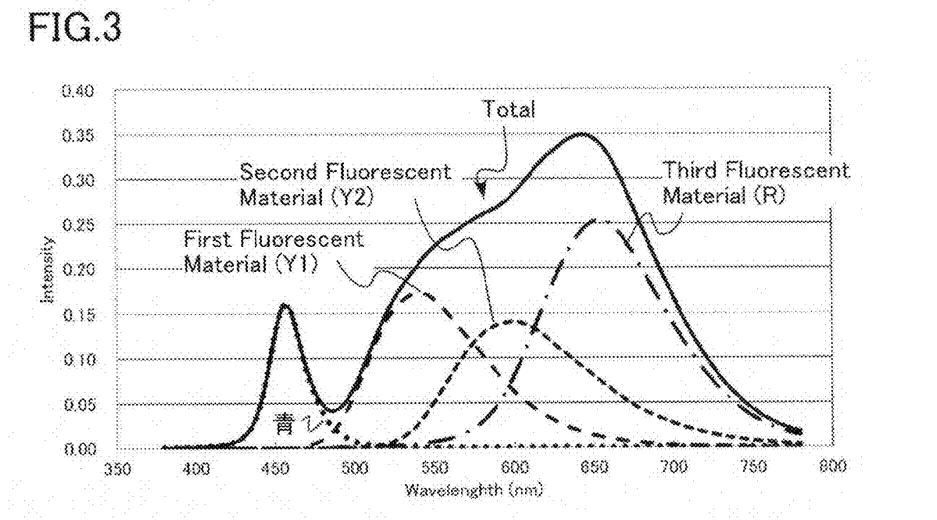
FIG. 3 is a diagram showing an example of emission spectra obtained from a simulation.

FIG. 3 is a diagram showing an example of emission spectra obtained from the simulation. The spectrum shown in FIG. 3 is an example obtained from the calculation result, which is a spectrum in line with a incandescent lamp color in the case of 541 nm for the emission peak wavelength λ1 of the fluorescent material on the shorter wavelength side and 599 nm for the emission peak wavelength λ2 of the fluorescent material on the longer wavelength side. The lumen equivalent is 264 lm/W, and Ra is 91.

Figure 4A:
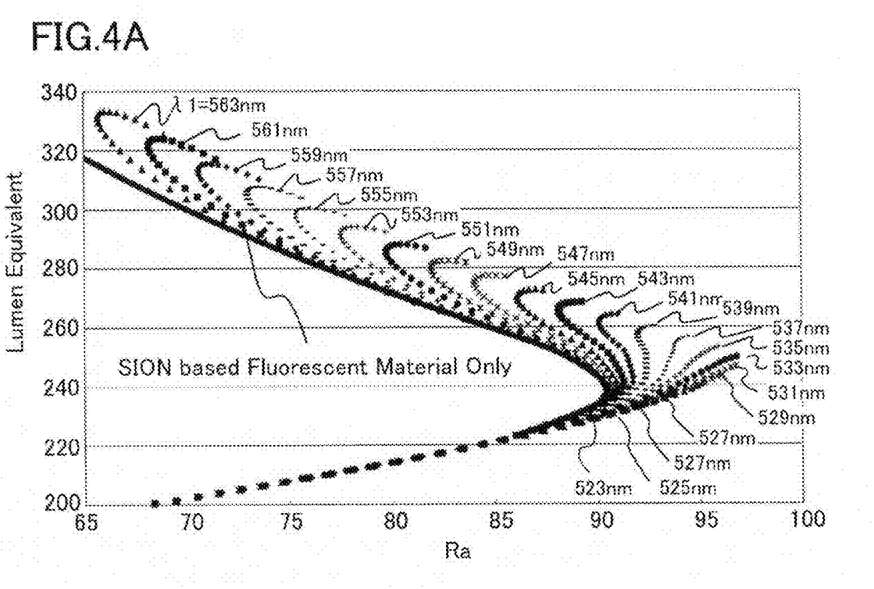
FIGS. 4A and 4B are diagrams showing simulation results in the present embodiment.
Figure 4B:
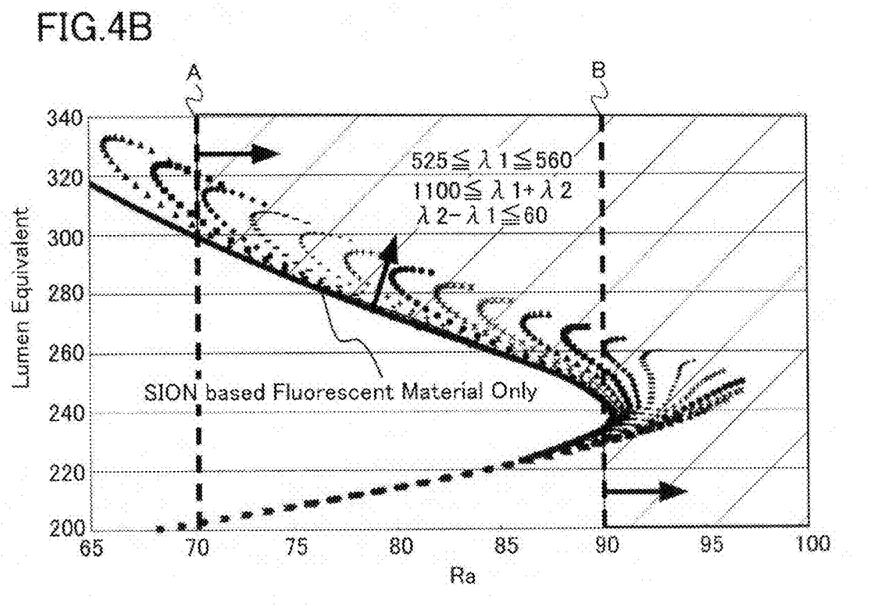

FIGS. 4A and 4B are diagrams showing simulation results in the present embodiment. FIG. 4A shows the simulation results, and FIG. 4B is a diagram for explaining the function and effect.

In FIGS. 4A and 4B, for comparison, the characteristic curve in the case of the one kind of SION as shown in FIG. 2 is also shown by a solid line. In addition, respective points (marks) plotted refer to characteristic curves in the case of applying the two kinds of SION based fluorescent materials Y1 and Y2. The same mark represents a case in which the fluorescent material Y1 has the same peak wavelength λ1. As is clear from FIGS. 4A and 4B, it has been found that there is a range in which the combination of the two kinds of fluorescent materials improves characteristics more than the one kind of fluorescent material.

In FIG. 4B, the range hatched with diagonal lines is a range which includes practical characteristics, and improves the characteristics more than in the case of one kind of fluorescent material. More specifically, the practically required Ra is generally 70 or more (a right range from a dotted line A), where there is a range in which a high luminescent efficiency is achieved at the same Ra as in the case of one kind of SION based fluorescent material (an upper range from the solid line), or a range in which Ra is achieved which is not able to be achieved by the SION-based fluorescent material (a right range from a dotted line B).

In FIG. 4B, in order to achieve characteristics in the range hatched with diagonal lines, from the simulation result, there is a need to satisfy the condition of 525≤λ1≤560, 1100≤λ1+λ2, and λ2−λ1≤60 when the first peak wavelength of the first SION based fluorescent material Y1 is denoted by λ1 (nm), whereas the second peak wavelength of the second SION based fluorescent material Y2 is denoted by λ2 (nm).

Figure 5:
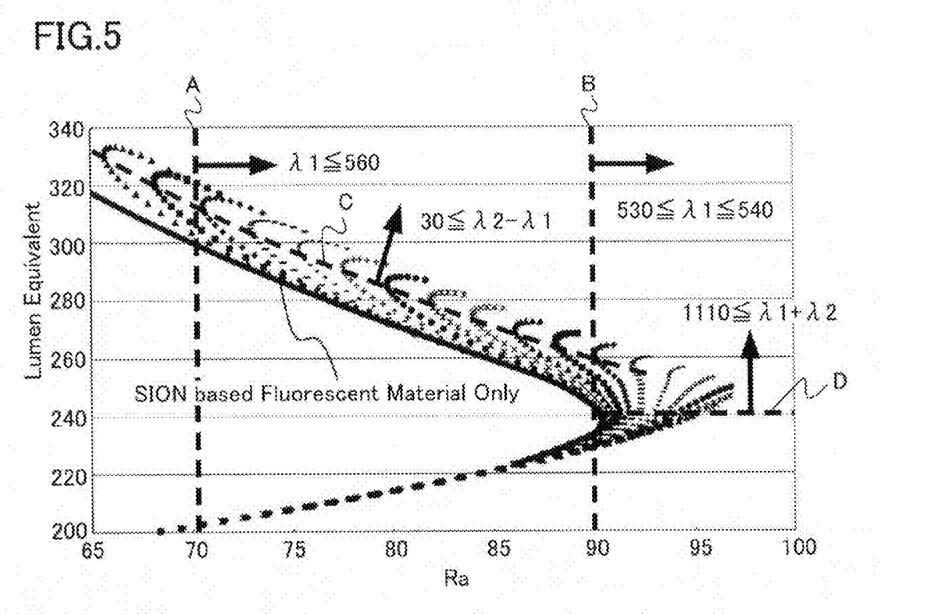
FIG. 5 is a diagram for explaining the function and effect of the embodiment.

FIG. 5 is a diagram for explaining the function and effect of the embodiment.

The white light emitting device desirably satisfies the condition of 30≤λ2−λ1. The satisfaction of this condition achieves characteristics in the upper right range from a dotted line C as shown in FIG. 5. More specifically, in the upper right range from the inflection point of the characteristic curve according to the embodiment, the characteristics are improved more than in the case of the one kind of SION based fluorescent material. The condition is more desirably 40≤λ2≤λ1 for improving the luminescent efficiency.

The white light emitting device desirably satisfies the condition of 1110≤λ1+λ2. The satisfaction of this condition achieves characteristics in the upper range from a dotted line D as shown in FIG. 5. More specifically, in the range in which the luminescent efficiency is always higher than in the case of reaching the highest Ra with the one kind of SION based fluorescent material, the characteristics are improved more than in the case of the one kind of SION based fluorescent material only.

Furthermore, the white light emitting device desirably satisfies the condition of 530≤λ1≤540. The satisfaction of this condition achieves characteristics in the always right range from a dotted line B as shown in FIG. 5. More specifically, in the range always with Ra of 90 or more, the characteristics are improved more than in the case of the one kind of SION based fluorescent material.

It is to be noted that it is also possible to further include another kind of fluorescent material, in addition to the three kinds of fluorescent materials in total: the two kinds of yellow-green to orange fluorescent materials and one kind of red fluorescent material according to the embodiment. However, there is a possibility that four or more kinds of fluorescent materials will decrease the luminescent efficiency due to reabsorption between the fluorescent materials, etc. Therefore, the fluorescent materials included in the fluorescent layer are desirably only the three kinds of fluorescent materials in total: the two kinds of yellow-green to orange fluorescent materials and the one kind of red fluorescent material.

According to the present embodiment, a white light emitting device is provided which can achieve high color rendering properties and a high luminescent efficiency. In addition, a white light emitting device is provided which has color deviations suppressed in high-temperature operation.

For comparison, the same simulation was run for a YAG:Ce fluorescent material. As for the full width at half maximum, a typical value for the YAG:Ce fluorescent material were used.

More specifically, a value of 110 nm was used for both Y1 on the shorter wavelength side and Y2 on the longer wavelength side.

As a result, in the case of the YAG:Ce fluorescent material, even with the combination of two kinds of fluorescent materials, the characteristics were never improved more than in the case of one kind of fluorescent material.

This difference is considered partly because the luminescent efficiency is improved by the narrow full width at half maximum for the fluorescent material combined. In particular, it is considered effective to make the full width at half maximum narrower on the longer wavelength side.

Therefore, the Y1 on the shorter wavelength side desirably has 100 nm or less. In addition, the Y2 on the longer wavelength side desirably has 100 nm or less, and more desirably 80 nm or less.

Second Embodiment

Except that two kinds of SION based fluorescent materials are mixed and contained in one fluorescent layer, a white light emitting device according to the present embodiment is the same as in the first embodiment. Therefore, the contents overlapping with the first embodiment will not be repeated.

Figure 6:
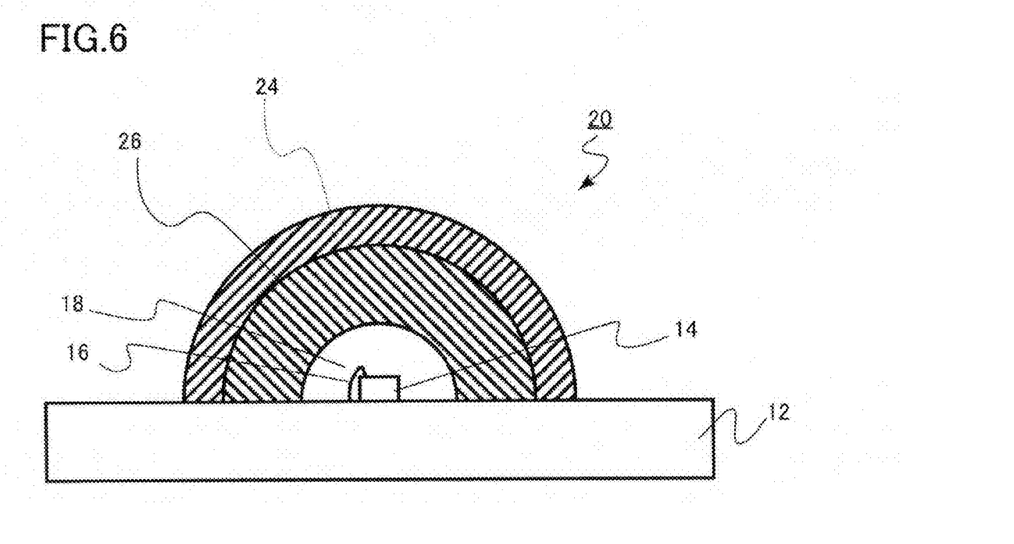
FIG. 6 is a schematic cross-sectional view of a light emitting device according to a second embodiment.

FIG. 6 is a schematic cross-sectional view of the light emitting device according to the present embodiment. This light emitting device 20 is a white light emitting device which emits white light.

The light emitting device 20 includes a fluorescent layer 26, in place of the first fluorescent layer 20 and second fluorescent layer 22 according to the first embodiment. The fluorescent layer 26 contains therein a mixture of a first fluorescent material which emits light with a first peak wavelength of 525 nm or more and 560 nm or less, with the use of light emitted from the light emitting element 14 as excitation light, and a second fluorescent material which emits light with a second peak wavelength longer than the first peak wavelength, with the use of light emitted from the light emitting element 14 as excitation light.

According to the present embodiment, as in the case of the first embodiment, a white light emitting device is provided which can achieve high color rendering properties and a high luminescent efficiency. In addition, a white light emitting device is provided which has color deviations suppressed in high-temperature operation. Furthermore, the formation of the fluorescent layer is simple, thus facilitating the manufacture of the white light emitting device.

The case of using the AlGaInN based LED with GaInN as the light emitting layer has been described as examples in the embodiments. LEDs can be also used which use an aluminum gallium indium nitride (AlGaInN) which is a III-V group compound semiconductor, or a magnesium zinc oxide (MgZnO) which is a II-VI group compound semiconductor, or the like as the light emitting layer (active layer). For example, the III-V group compound semiconductor to be used as the light emitting layer is a nitride semiconductor containing at least one selected from the group including Al, Ga, and In. This nitride semiconductor is specifically represented by $Al_xGa_yIn_{(1-x-y)}N(0 \leq x \leq 1, 0 \leq y \leq 1, 0 \leq (x+y) \leq 1)$. This type of nitride semiconductor includes all of: binary compounds of AlN, GaN, and InN; ternary compounds of $Al_xGa_{(1-x)}N(0<x<1)$, $Al_xIn_{(1-x)}N(0<x<1)$, and $Ga_yIn_{(1-y)}N(0<y<1)$; and further quaternary compounds containing all of the elements. The emission peak wavelength is determined in the range of ultraviolet to blue, on the basis of the composition of Al, Ga, and In: x, y, and (1-x-y). In addition, some of the group III element can be substituted for boron (B), thallium (Tl), and the like.

Furthermore, some of N that is the group V element can be substituted for phosphorous (P), arsenic (As), antimony (Sb), bismuth (Bi) and the like.

Similarly, an oxide semiconductor containing at least one of Mg and Zn can be used as the II-VI group compound semiconductor to be used as the light emitting layer. Specifically, examples of the oxide semiconductor include semiconductors represented by $Mg_zZn_{(1-z)}O(0 \leq z \leq 1)$, and the emission peak wavelength in an ultraviolet range is determined on the basis of the composition of Mg and Zn:z and (1-z).

While the silicone resin as the transparent base material for the fluorescent layer has been described as an example, any material can be used which highly transmits the excitation light and has high heat resistance. As such a material, for example, an epoxy resin, a urea resin, a fluorine resin, an acrylic resin, and a polyimide resin, etc. can be used in addition to silicone resin. In particular, the epoxy resin or the silicone resin is preferably used because of easy availability, easy handling, and moreover inexpensiveness. In addition, glass, a sintered body, etc. can be also used besides the resins.

In addition, the following nitride fluorescent material and oxysulfide fluorescent material as well as oxynitrides, and the like can be used as the red fluorescent material.

Nitride Based fluorescent material (mainly a silicon nitride based fluorescent material) and Oxynitride Based fluorescent material: $L_xSi_yN_{(2x/3+4y/3)}$:Eu or $L_xSi_yO_zN_{(2x/3+4y/3-2z/3)}$:Eu (L represents at least one element selected from the group including Sr, Ca, and Sr and Ca):

While the composition mentioned above desirably has x=2 and y=5, or x=1 and y=7, x and y can be any value. A fluorescent material, such as $(Sr_xCa_{(1-x)})_2Si_5N_8$:Eu, $Sr_2Si_5N_8$:Eu, $Ca_2Si_5N_8$:Eu, $Sr_xCa_{(1-x)}Si_7N_{10}$:Eu, $SrSi_7N_{10}$:Eu, or $CaSi_7N_{10}$:Eu, which has Mn added as an activator agent, is desirably used as the nitride based fluorescent material represented by the above formula. These fluorescent materials may contain at least one element selected from the group including Mg, Sr, Ca, Ba, Zn, B, Al, Cu, Mn, Cr, and Ni. In addition, the fluorescent materials may contain at least one element selected from the group including Ce, Pr, Tb, Nd, and La as an activator agent. Alternatively, a sialon based fluorescent material with some of Si substituted for $Al:L_xSi_yAl_{(12-y)}O_zN_{(18-z)}$:Eu may be used (L is at least one element selected from the group including Sr, Ca, and Sr and Ca).

Oxysulfide Fluorescent Material: $(Ln_{(1-x)}Eu_x)O_2S$ (Ln is at least one element selected from the group including Sc, Y, La, Gd, and Lu, and x is a numerical value which satisfies $0 \leq x \leq 1$)

Further, at least one selected from the group including Tb, Pr, Mg, Ti, Nb, Ta, Ga, Sm, and Tm may be contained as an activator agent.

While certain embodiments have been described, these embodiments have been presented by way of example only, and are not intended to limit the scope of the inventions. Indeed, the white light emitting device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:
1. A white light emitting device comprising:
   a light emitting element having a peak wavelength in a wavelength range of 430 nm or more and 470 nm or less;
   a first fluorescent material which emits light with a first peak wavelength of 525 nm or more and 560 nm or less;

a second fluorescent material which emits light with a second peak wavelength longer than the first peak wavelength; and
a third fluorescent material which emits light with a third peak wavelength of 620 nm or more and 750 nm or less, the third peak wavelength longer than the second peak wavelength,
wherein the first fluorescent material and the second fluorescent material has are different from one another but each have a composition of:

$MSi_\alpha O_\beta N_\gamma$ where M comprises Eu, at least one of Sr and Ba, optionally Ca, Mg, or Zn, and further optionally, as an activator agent, one or more elements selected from the group consisting of Ti, Pb, Mn, As, Al, Pr, Tb, and Ce; $1.8 \leq \alpha \leq 2.4$, $1.8 \leq \beta \leq 2.2$, and $1.8 \leq \gamma \leq 2.2$
and wherein the first peak wavelength is denoted by $\lambda 1$ (nm), the second peak wavelength is denoted by $\lambda 2$ (nm), and the following conditions:
$1100 \leq \lambda 1 + \lambda 2$; and $\lambda 2 - \lambda 1 \leq 60$ are satisfied.

2. The device according to claim 1, wherein the device satisfies $30 \leq \lambda 2 - \lambda 1$.

3. The device according to claim 1, wherein the device satisfies $1110 \leq \lambda 1 + \lambda 2$.

4. The device according to claim 1, wherein the device satisfies $530 \leq \lambda 1 \leq 540$.

5. The device according to claim 1, wherein the light emitting element is a blue LED.

6. A white light emitting device comprising:
a substrate;
a light emitting element having a peak wavelength in a wavelength range of 430 nm or more and 470 nm or less, the light emitting element mounted on the substrate;
a first fluorescent layer comprising a first fluorescent material which emits light with a first peak wavelength of 525 nm or more and 560 nm or less, the first fluorescent layer formed above the light emitting element;
a second fluorescent layer comprising a second fluorescent material which emits light with a second peak wavelength longer than the first peak wavelength, the second fluorescent layer formed above the first fluorescent layer; and
a third fluorescent layer comprising a third fluorescent material which emits light with a third peak wavelength of 620 nm or more and 750 nm or less, the third peak wavelength longer than the second peak wavelength, the third fluorescent layer formed above the second fluorescent layer,
wherein the first fluorescent material and the second fluorescent material has are different from one another but each have a composition of:

$MSi_\alpha O_\beta N_\gamma$ where M comprises Eu, at least one of Sr and Ba, optionally Ca, Mg, or Zn, and further optionally, as an activator agent, one or more elements selected from the group consisting of Ti, Pb, Mn, As, Al, Pr, Tb, and Ce; $1.8 \leq \alpha \leq 2.4$, $1.8 \leq \beta \leq 2.2$, and $1.8 \leq \gamma \leq 2.2$
and wherein the first peak wavelength is denoted by $\lambda 1$ (nm), the second peak wavelength is denoted by $\lambda 2$ (nm), and the following conditions:
$1100 \leq \lambda 1 + \lambda 2$; and $\lambda 2 - \lambda 1 \leq 60$ are satisfied.

7. The device according to claim 6, wherein the device satisfies $30 \leq \lambda 2 - \lambda 1$.

8. The device according to claim 6, wherein the device satisfies $1110 \leq \lambda 1 + \lambda 2$.

9. The device according to claim 6, wherein the device satisfies $530 \leq \lambda 1 \leq 540$.

10. The device according to claim 6, wherein the light emitting element is a blue LED.

11. The device according to claim 6, wherein an element sealing transparent layer composed of transparent resin is provided between the light emitting element and the first fluorescent layer.

12. The device according to claim 6, wherein the first, second, and third fluorescent layers have a semicircular circumference in cross section perpendicular to the flat surface of the substrate.

13. The device according to claim 1, wherein $2.0 \leq \alpha \leq 2.2$, $1.8 \leq \beta \leq 2.1$, and $1.9 \leq \gamma \leq 2.2$.

14. The device according to claim 1, wherein the first fluorescent material and the second fluorescent material are different from one another but each have the following composition:

$(Sr_{(1-x-y-z)}Ba_xCa_yEu_z)Si_2O_2N_2$ where $0 \leq x < 1$, $0 \leq y \leq 1$, and $0.01 \leq z \leq 0.2$.

15. The device according to claim 6, wherein $2.0 \leq \alpha \leq 2.2$, $1.8 \leq \beta \leq 2.1$, and $1.9 \leq \gamma \leq 2.2$.

16. The device according to claim 6, wherein the first fluorescent material and the second fluorescent material are different from one another but each have the following composition:

$(Sr_{(1-x-y-z)}Ba_xCa_yEu_z)Si_2O_2N_2$ where $0 \leq x < 1$, $0 \leq y \leq 1$, and $0.01 \leq z \leq 0.2$.

17. The device according to claim 1, wherein M comprises Ca, Mg, or Zn.

18. The device according to claim 1, wherein M comprises, as an activator agent, one or more elements selected from the group consisting of Ti, Pb, Mn, As, Al, Pr, Tb, and Ce.

19. The device according to claim 6, wherein M comprises Ca, Mg, or Zn.

20. The device according to claim 6, wherein M comprises, as an activator agent, one or more elements selected from the group consisting of Ti, Pb, Mn, As, Al, Pr, Tb, and Ce.

* * * * *